United States Patent
Kuo

(10) Patent No.: US 7,655,292 B2
(45) Date of Patent: Feb. 2, 2010

(54) ELECTRICALLY CONDUCTIVE SUBSTRATE WITH HIGH HEAT CONDUCTIVITY

(75) Inventor: Li-Wei Kuo, Bade (TW)

(73) Assignee: Kaylu Industrial Corporation, Bade, Taoyuan Hsien (TW)

( * ) Notice: Subject to any disclaimer, the term of this patent is extended or adjusted under 35 U.S.C. 154(b) by 315 days.

(21) Appl. No.: 11/733,994

(22) Filed: Apr. 11, 2007

(65) Prior Publication Data

US 2008/0254207 A1    Oct. 16, 2008

(51) Int. Cl.
*H05K 1/09* (2006.01)
(52) U.S. Cl. .................. 428/209; 174/255; 174/257; 174/258; 174/264; 428/901
(58) Field of Classification Search ................ 428/209, 428/901; 174/250, 264, 255, 258, 257
See application file for complete search history.

(56) References Cited

U.S. PATENT DOCUMENTS

| | | | | |
|---|---|---|---|---|
| 4,601,916 A | * | 7/1986 | Arachtingi | 204/479 |
| 4,732,636 A | * | 3/1988 | Varker | 156/252 |
| 4,769,270 A | * | 9/1988 | Nagamatsu et al. | 428/131 |
| 6,159,586 A | * | 12/2000 | Inoue et al. | 428/209 |
| 6,373,000 B2 | * | 4/2002 | Nakamura et al. | 174/264 |
| 7,112,285 B2 | * | 9/2006 | Chakravorty | 216/18 |

* cited by examiner

*Primary Examiner*—Cathy Lam
(74) *Attorney, Agent, or Firm*—patenttm.us

(57) ABSTRACT

An electrically conductive substrate with a high heat conductivity has an aluminum plate having multiple holes. An isolation layer is formed on the aluminum plate and inner walls of the holes. Multiple electrically conductive materials are inserted in the holes. A circuit layer is formed on the aluminum plate, electrically connects to the electrically conductive materials and has a rough surface. A graphite layer is formed on the rough surface of the circuit layer. The electric components are respectively provided on the holes, and the heat generated by the electric components is dissipated effectively by the aluminum plate.

6 Claims, 1 Drawing Sheet ized to cover an isolation layer (20) on the surface of the# ELECTRICALLY CONDUCTIVE SUBSTRATE WITH HIGH HEAT CONDUCTIVITY

BACKGROUND OF THE INVENTION

1. Field of the Invention

The present invention relates to an electrically conductive substrate, and more particularly to an electrically conductive substrate with high heat conductivity.

2. Description of the Related Art

Generally, a PCB substrate is used for electrical components to electrically connect to each other. However, conventional PCB substrates have low heat conductivity. Because electric components generate much heat or because the conventional PCB substrate is used in a closed environment such as inside a notebook computer, heat does not dissipate easily. Therefore, the electric components are damaged easily.

A conventional high-power light emitting Diode (LED) is one electric component that generates very much heat.

With the development of the LED, the LED can provide different colors of lights, namely, red, yellow, green, blue or white light. With the improvement of light intensity in the LED, the LED is gradually replacing traditional lighting.

To obtain a desired lighting effect, different LEDs are connected together and mounted on a conventional PCB substrate to efficiently provide the desired illumination.

However, LEDs generating high heat mounted on the conventional low heat conductive PCB substrate increase the chance of damage.

Therefore, the invention provides an electrically conductive substrate with high heat conductivity to mitigate or obviate the aforementioned problems.

SUMMARY OF THE INVENTION

The main objective of the present invention is to provide an electrically conductive substrate with a high heat conductivity to reduce damage and increase the efficiency.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
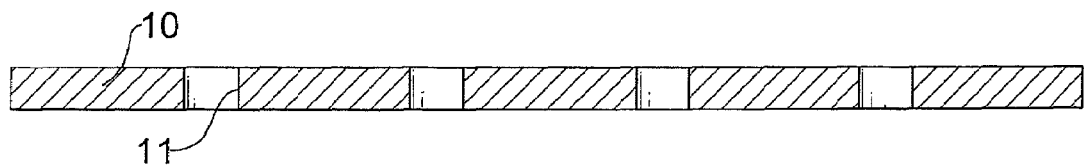
FIG. 1 is an operational side view in cross section of an electrically conductive substrate with high heat conductivity in accordance with the present invention when the substrate is drilling.

With reference to FIG. 1, an electrically conductive substrate with a high heat conductivity in accordance with the present invention has an aluminum plate (10). The electrical components and layouts of the electric components are determined on the aluminum plate (10). Multiple holes (11) corresponding to the determined positions of the electrical components are defined in the aluminum plate (10)

Figure 2:
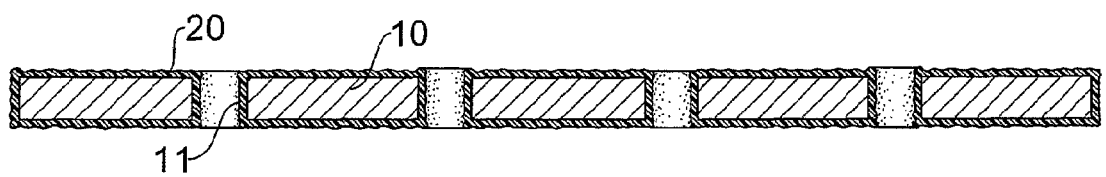
FIG. 2 is an operational side view in cross section of the electrically conductive substrate with high heat conductivity in FIG. 1 when the substrate is anodizing.

With further reference to FIG. 2, the aluminum plate (10) is anodized to cover an isolation layer (20) on the surface of the aluminum plate (10) and on the inner walls of the holes (11).

Figure 3:
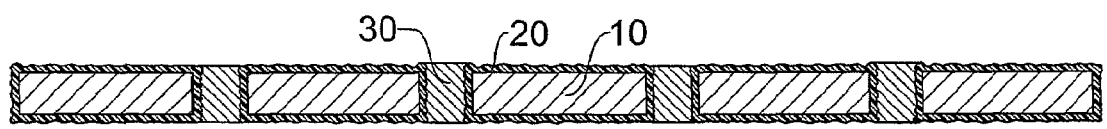
FIG. 3 is an operational side view in cross section of the electrically conductive substrate with high heat conductivity in FIG. 1 when the copper paste is poured into the substrate.

With further reference to FIG. 3, multiple copper pastes (30) or copper bars are poured into the holes (11) to form electrical contacts. In this preferred embodiment, the copper pastes (30) are poured into the holes (11) as electrically conductive materials. Furthermore, the copper pastes (30) extending out of the holes (11) are trimmed to keep the surface of the aluminum plate (10) flat.

Figure 4:
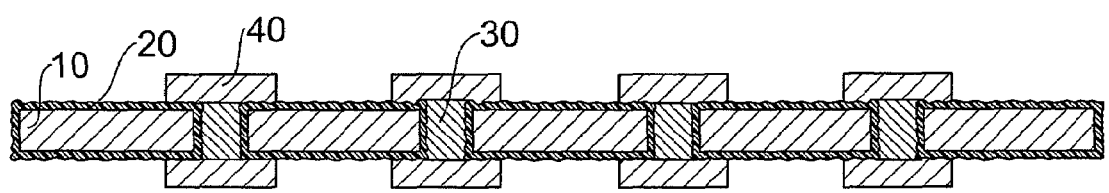
FIG. 4 is an operational side view in cross section of the electrically conductive substrate with high heat conductivity in FIG. 1 when the circuit is formed on the substrate.

With further reference to FIG. 4, metallic powder and uncured epoxy are mixed into liquid to print onto the isolation layer covering the aluminum plate (10) to form a circuit layer (40) to electrically connect the electrical contacts in the holes (11).

Figure 5:
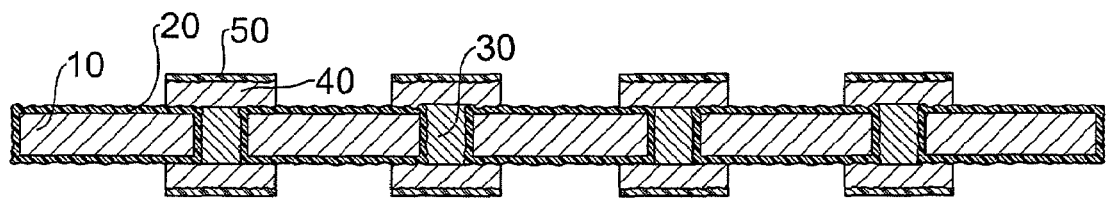
FIG. 5 is an operational side view in cross section of the electrically conductive substrate with high heat conductivity in FIG. 1 after the substrate is etched and then the graphite is electroplated.

With reference to FIG. 5, the circuit layer (40) is etched to form a rough surface. In the preferred embodiment, the plate (10) is entirely proceeded the etch treatment. Because the circuit layer (40) is easier to be etched than the plate (10), the circuit layer (40) is etched to form a predetermined pattern.

A graphite layer (50) is formed on the rough surface of the circuit layer (40). The graphite layer (50) may be electroplated on the circuit layer (40). With the rough surface of the circuit layer (40), the graphite layer (50) easily connects to the circuit layer (40) to protect the circuit layer (40).

The electric components are respectively provided on the holes (11) by means of cohesion and connect to each other by the circuit layer (40).

Meanwhile, the heat generated by the electric components is dissipated effectively by the aluminum plate (10). Hence, the substrate of the present invention can be widely applied in TFT-LCD TV, lighting equipment with dense LCD or laptop.

It is to be understood, however, that even though numerous characteristics and advantages of the present invention have been set forth in the foregoing description, together with details of the structure and function of the invention, the disclosure is illustrative only. Changes may be made in details, especially in matters of shape, size, and arrangement of parts within the principles of the invention to the full extent indicated by the broad general meaning of the terms in which the appended claims are expressed.

What is claimed is:

1. An electrically conductive substrate comprising:
an aluminum plate having multiple holes defined in the aluminum plate and each hole having an inner wall;
an isolation layer covering on the aluminum plate and the inner walls of the holes;
multiple electrically conductive materials inserted in the holes;

a circuit layer formed on the isolation layer covering the aluminum plate and electrically connected to the electrically conductive materials and having a rough surface; and a graphite layer formed on the rough surface of the circuit layer.

2. The electrically conductive substrate with high heat conductivity as claimed in claim 1, wherein the isolation layer is formed in the inner wall of the holes by means of anodization.

3. The electrically conductive substrate with high heat conductivity as claimed in claim 1, wherein the circuit layer comprises metallic powder and uncured epoxy mixed in liquid and is printed onto the isolation layer covered aluminum plate.

4. The electrically conductive substrate with high heat conductivity as claimed in claim 1, wherein the electrically conductive materials are copper pastes.

5. The electrically conductive substrate with high heat conductivity as claimed in claim 1, wherein the electrically conductive materials are copper bars.

6. The electrically conductive substrate with high heat conductivity as claimed in claim 1, wherein the graphite layer is electroplated on the rough surface of the circuit layer.

* * * * *